United States Patent
Chen et al.

(10) Patent No.: US 7,675,330 B2
(45) Date of Patent: Mar. 9, 2010

(54) LOW POWER DIFFERENTIAL SIGNALING TRANSMITTER

(75) Inventors: Chien-Chung Chen, Pingtung County (TW); Chien-Cheng Tu, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 16 days.

(21) Appl. No.: 12/057,394

(22) Filed: Mar. 28, 2008

(65) Prior Publication Data

US 2009/0160495 A1 Jun. 25, 2009

(30) Foreign Application Priority Data

Dec. 21, 2007 (TW) .............................. 96149276 A (51) Int. Cl.
*H03B 1/00* (2006.01)

(52) U.S. Cl. .......................... 327/108; 327/66; 327/424

(58) Field of Classification Search ......... 327/108–112, 327/170, 423, 424, 588, 63, 65, 66, 563; 326/22–24, 26, 27, 82, 83; 330/258, 253
See application file for complete search history.

(56) References Cited

U.S. PATENT DOCUMENTS

| | | | |
|---|---|---|---|
| 6,316,964 B1 * | 11/2001 | Watarai | 326/115 |
| 6,927,608 B1 | 8/2005 | Chen et al. | |
| 7,420,404 B2 * | 9/2008 | Ito et al. | 327/231 |
| 2004/0150434 A1 | 8/2004 | Lu | |
| 2004/0247036 A1 * | 12/2004 | Hedberg et al. | 375/257 |
| 2008/0054953 A1 * | 3/2008 | Chen et al. | 327/108 |
| 2008/0136465 A1 * | 6/2008 | Takagi | 327/108 |

* cited by examiner

*Primary Examiner*—Long Nguyen
*Assistant Examiner*—Sibin Chen
(74) *Attorney, Agent, or Firm*—Jianq Chyun IP Office (57) ABSTRACT

A low power differential signaling transmitter includes a switchable current source apparatus and a differential signaling generator coupled to the switchable current source apparatus. The switchable current source apparatus receives a first input voltage and a second input voltage, and generates a plurality of reference currents according to the first input voltage and the second input voltage. The differential signaling generator includes a plurality of first transistors, a plurality of second transistors, a first output voltage terminal and a second output voltage terminal. The on or off states of the first transistors and the second transistors are controlled by the reference currents. The first output voltage terminal outputs a first output voltage, and the second output voltage terminal outputs a second output voltage. The first output voltage and the second output voltage are determined according to the on or off states of the first and second transistors.

19 Claims, 9 Drawing Sheets

LOW POWER DIFFERENTIAL SIGNALING TRANSMITTER

CROSS-REFERENCE TO RELATED APPLICATION

This application claims the priority benefit of Taiwan application serial no. 96149276, filed on Dec. 21, 2007. The entirety the above-mentioned patent application is hereby incorporated by reference herein and made a part of specification.

BACKGROUND OF THE INVENTION

1. Field of the Invention

The present invention generally relates to a differential signaling transmitter, and more particularly, to a low power differential signaling transmitter.

2. Description of Related Art

For the purpose of improving a sensitivity and saving power consumption of electronic components, a differential input is often employed for amplifying a small amplitude so as to convey information therein in accordance with the value of the amplified amplitude, and transmitting as an information signal. Typically, a conventional differential signaling transmitter works when a power source voltage VDD is greater than 2.5V. However, when the power source voltage VDD is smaller than 2.0V (e.g., a 0.18 μm semiconductor processing requires a power source voltage of 1.8V), failures of the conventional differential signaling transmitter may be caused by a lack of headroom in the VDD direction. It is caused by a finite on-resistance of a PMOS transistor switch, and the finite on-resistance may generate a span voltage over the transistor and thus consumes the headroom. As such, a greater power source voltage is required for allowing the differential signaling transmitter to work normally.

Figure 1:
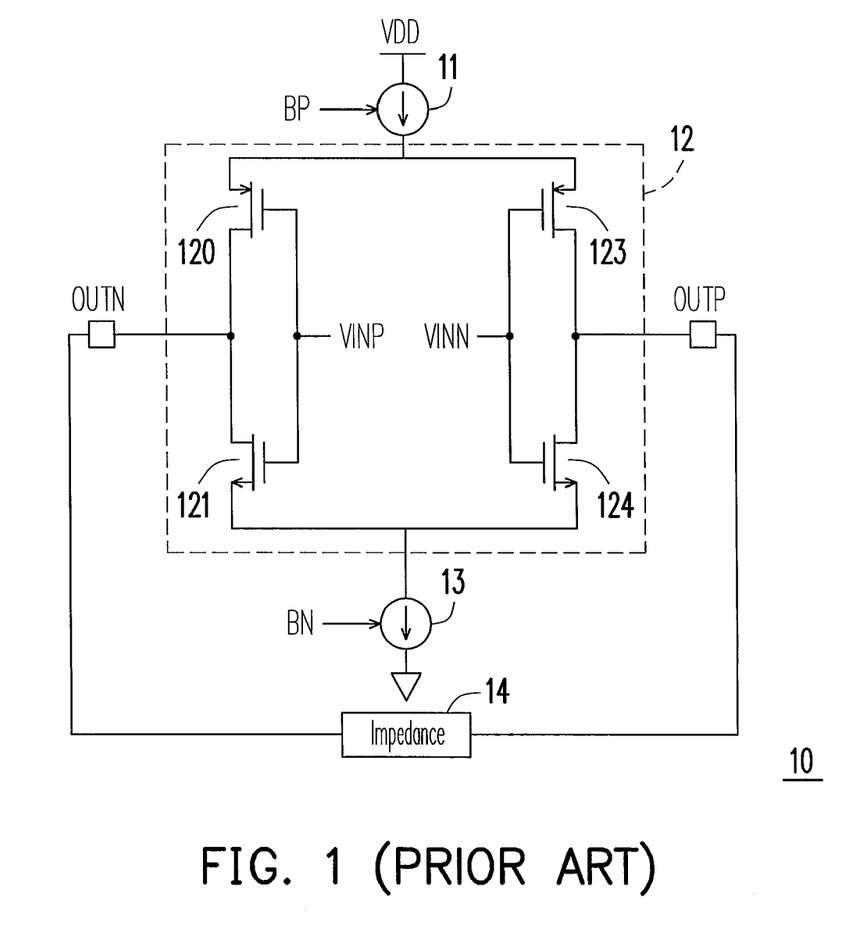
FIG. 1 is a circuit diagram of a conventional differential signaling transmitter 10.

FIG. 1 is a circuit diagram of a conventional differential signaling transmitter. Referring to FIG. 1, a conventional differential signaling transmitter 10 includes current sources 11, 13, an inverter switching circuit 12 and an impedance 14. The inverter switching circuit 12 includes two output terminals, OUTP and OUTN. The current source 11 is coupled to the inverter switching circuit 12, and the inverter switching circuit 12 is coupled to the current source 13. The impedance 14 has two terminals respectively coupled to the output terminals OUTP and OUTN of the inverter switching circuit 12.

The inverter switching circuit 12 includes transistors 120, 121, 123 and 124. The transistors 120 and 123 are PMOS transistors. The transistors 121 and 124 are NMOS transistors. The transistors 120 and 121 are coupled together and form a first inverter. The transistors 123 and 124 are coupled together and form a second inverter. The first inverter receives a first input voltage VINP, and the second inverter receives a second input voltage VINN. The current sources 11 and 13 are controlled by the bias signals BP and BN respectively, and provide currents to the inverter switching circuit 12, respectively.

When the first input voltage VINP is at a high voltage level, and the second input voltage VINN is relatively at a low voltage level, the transistors 123 and 121 are turned on, and the transistors 120 and 124 are cut off, and in this case the current flows from the transistor 123 to the impedance 14 and then flows to the transistor 121. Therefore, a differential voltage signal conformed at the output terminals OUTP and OUTN is equal to a product of the current value flowing through the impendence 14 and the resistance of the impendence 14. The difference between the output terminals OUTP and OUTN is positive in this case.

Otherwise, when the first input voltage VINP is at a low voltage level, and the second input voltage VINN is at a high voltage level relatively, the transistors 120 and 124 are turned on, and the transistors 121 and 123 are cut off, and in this case the current flows from the transistor 120 to the impedance 14 and then flows to the transistor 124. Therefore, a differential voltage signal conformed at the output terminals OUTP and OUTN is equal to a product of the current value flowing through the impendence 14 and the resistance of the impendence 14. The difference between the output terminals OUTP and OUTN is negative in this case.

As discussed above, the conventional differential signaling transmitter works when a power source voltage VDD is greater than 2.5V, but may fail to work when the power source voltage VDD is smaller than 2V due to a lack of headroom in the direction of VDD. For resolving this problem, U.S. Patent Application No. 2004/0150434 provides a low voltage differential signaling (LVDS) driving apparatus. Comparing to the differential signaling transmitter 10 of FIG. 1, the LVDS driving apparatus does not include a current source, and therefore, the headroom can be reduced. The LVDS driving apparatus employs a reference current control circuit to provide a plurality of reference voltages for a plurality of gates of transistor switches. Each of the transistor switches includes a PMOS transistor and a NMOS transistor. Each of the transistor switches can be turned on by coupling their gates to the reference voltages, and can be cut off by switching the gate of the PMOS transistor to be coupled to the voltage VDD or switch the gate of the NMOS transistor to be coupled to a ground terminal GND.

Figure 2:
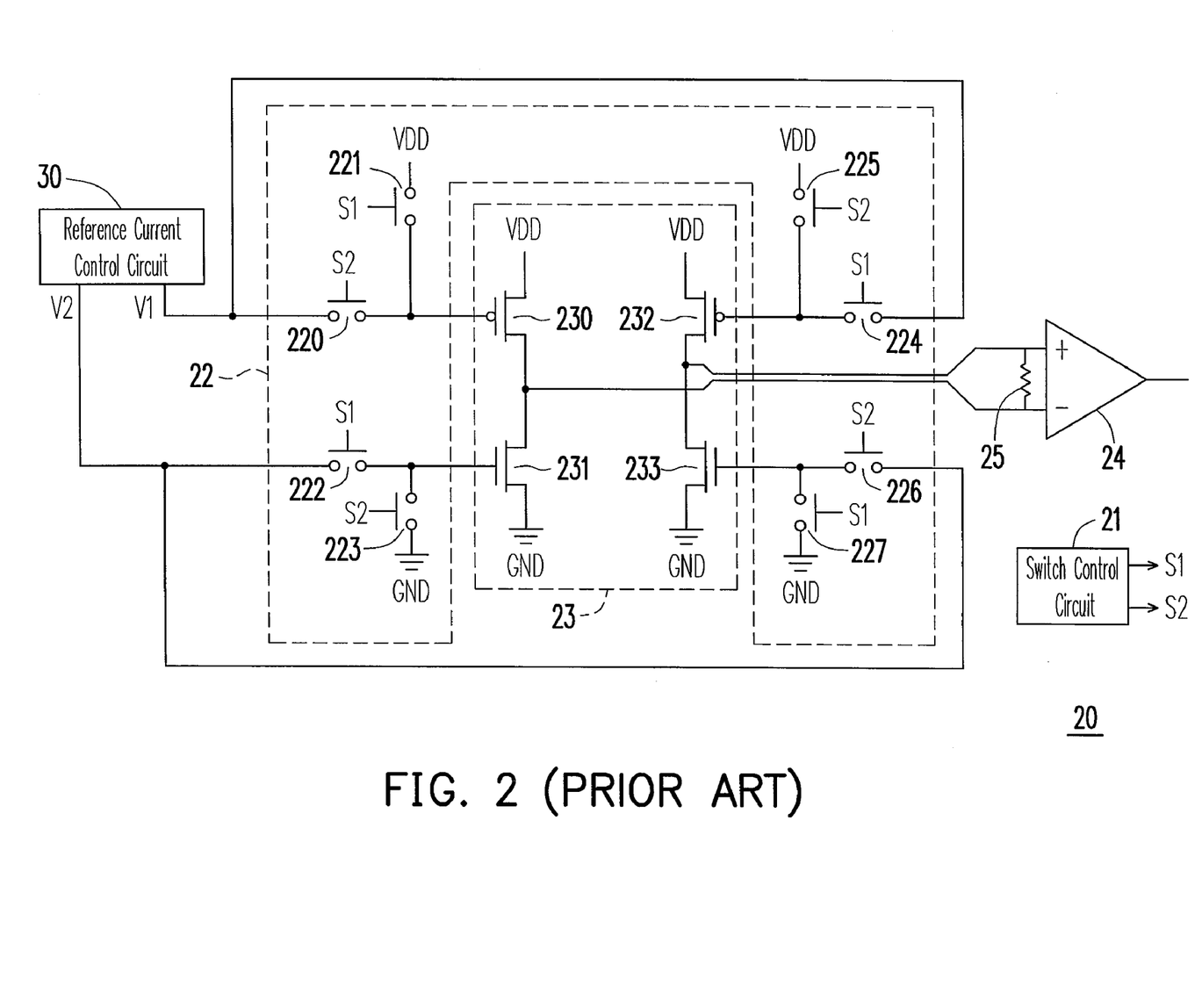
FIG. 2 is a circuit diagram of the LVDS driving apparatus 20 of U.S. Patent Application No. 2004/0150434.

FIG. 2 is a circuit diagram of the LVDS driving apparatus 20 of U.S. Patent Application No. 2004/0150434. Referring to FIG. 2, the apparatus 20 includes a switch control circuit 21, a reference current control circuit 30, a switch circuit 22, a differential signal output circuit 23, a resistor 25, and a differential amplifier 24. The switch circuit 22 is coupled to the reference current control circuit 30 and the switch control circuit 21. The differential signal output circuit 23 is coupled to the switch circuit 22. The resistor 25 has two terminals respectively coupled to two output terminals of the differential signal output circuit 23. The differential amplifier 24 has two input terminals respectively coupled to the two terminals of the resistor 25.

The switch control circuit 21 is adapted for providing switch control signals S1 and S2. The reference current control circuit 30 is adapted for generating a first reference voltage V1 and a second reference voltage V2. The switch circuit 22 generates a span voltage over the two terminals of the resistor 25 coupled thereto, according to the switch control signals S1 and S2. The differential amplifier 24 amplifies the span voltage over the two terminals of the resistor 25.

As shown in FIG. 2, the switch circuit 22 includes switches 220, 221, 222, 223, 224, 225, 226, and 227. The switches 220, 223, 225, and 226 are controlled by the control signal S2, and the switches 221, 222, 224, and 227 are controlled by the control signal S1. One terminal of the switch 220 is used for receiving a first reference voltage V1, and another terminal of the switch 220 is coupled to the switch 221. One terminal of the switch 222 is used for receiving a second reference voltage V2, and another terminal of the switch 222 is coupled to the switch 223. One terminal of the switch 224 is used for receiving the first reference voltage V1, and another terminal of the switch 224 is coupled to the switch 225. One terminal of the switch 226 is used for receiving the second reference voltage V2, and another terminal of the switch 226 is coupled to the switch 227.

The differential signal output circuit 23 includes transistors 230, 231, 232, and 233. The transistors 230 and 232 are PMOS transistors, while the transistors 231 and 233 are NMOS transistors. A gate of the transistor 230 is coupled to the switches 221 and 220. A gate of the transistor 231 is coupled to the switches 222 and 223. A gate of the transistor 232 is coupled to the switches 224 and 225. A gate of the transistor 233 is coupled to the switches 227 and 226.

When the control signal S2 is at a high level, and the control signal S1 is at a low level, the switches 220, 223, 225 and 226 are turned on, and the switches 221, 222, 224, and 227 are cut off. In this case, the gate voltage of the transistor 230 is the first reference voltage V1, and the gate voltage of the transistor 232 is the voltage VDD. The gate voltage of the transistor 231 is the ground GND, and the gate voltage of the transistor 233 is the second reference voltage V2. By designing the reference current control circuit 30 to generate the first reference voltage V1, the second reference voltage V2, the transistors 230 and 233 are turned on and the transistors 231 and 232 are cut off. As such, the current passing by the transistor 25 is flowing upwardly, and the value of the differential voltage amplified by the differential amplifier 24 is negative.

On the contrary, when the control signal S2 is at a low level, and the control signal S1 is at a high level, the switches 220, 223, 225 and 226 are cut off, and the switches 221, 222, 224, and 227 are turned on. In this case, the gate voltage of the transistor 230 is the voltage VDD, and the gate voltage of the transistor 232 is the first reference voltage V1. The gate voltage of the transistor 231 is the second reference voltage V2, and the gate voltage of the transistor 233 is the ground GND. By designing the reference current control circuit 30 to generate the first reference voltage V1, the second reference voltage V2, the transistors 231 and 232 are turned on and the transistors 230 and 233 are cut off. As such, the current passing by the transistor 25 flows downwards, and the value of the differential voltage amplified by the differential amplifier 24 is positive.

Figure 3:
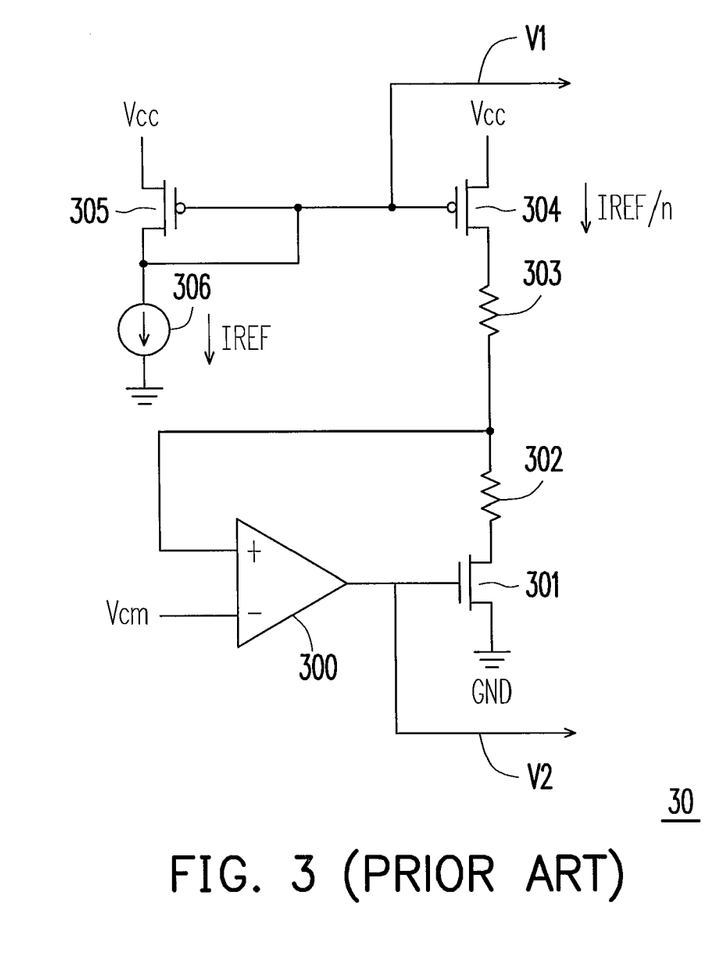
FIG. 3 is a circuit diagram illustrating the reference current control circuit 30.

FIG. 3 is a circuit diagram illustrating the reference current control circuit 30. Referring to FIG. 3, the reference current control circuit 30 includes an operation amplifier 300, transistors 301, 304, 305, resistors 302, 303, and a current source 306. The transistors 304 and 305 are coupled together. The current source 306 is coupled to the transistor 305. The resistor 303 is coupled to the transistor 304. The resistor 302 is coupled to the transistor 301 and the resistor 303. A gate of the transistor 301 is coupled to an output terminal of the operation amplifier 300. The operation amplifier 300 includes a positive input terminal and a negative input terminal respectively coupled to the resistor 302 and a preset common mode voltage Vcm. The transistors 304 and 305 are PMOS transistors configuring a current mirror for generating the first reference voltage V1 which is sufficient for turning on the PMOS transistors 230 and 232. The current source 306 provides a current IREF to the current mirror, and the transistor 304 outputs a current IREF/n. The transistor 301 is an NMOS transistor. The transistor 301, the resistor 302, and the operation amplifier 300 form a negative feedback loop for generating the second reference voltage V2 which is sufficient for turning on the NMOS transistors 231 and 233. Generally, the reference current control circuit 30 generates the first reference voltage V1 and the second reference voltage V2, so as to control the differential signaling transmitter 20 to output a differential signal having a positive voltage value when the control signal S1 is at a high level, and the control signal S2 is at a low level; and output a differential signal having a negative voltage value when the control signal S1 is at a low level, and the control signal S2 is at a high level.

Further, U.S. Pat. No. 6,927,608 discloses another differential signaling transmitter which is named as a low power LVDS driver therein. The low power LVDS driver employs a switchable current source control circuit for generating a plurality of reference voltages to the gates of transistor switches. The gates of the transistor switches can be coupled to the reference voltages to turn on the transistor switches, or disconnected from the reference voltages to cut off the transistor switches. The gates of the transistor switches can be speeded up by introducing the active or passive pull up or down circuits, so as to allow the gates to achieve their ultimate voltages.

Figure 4:
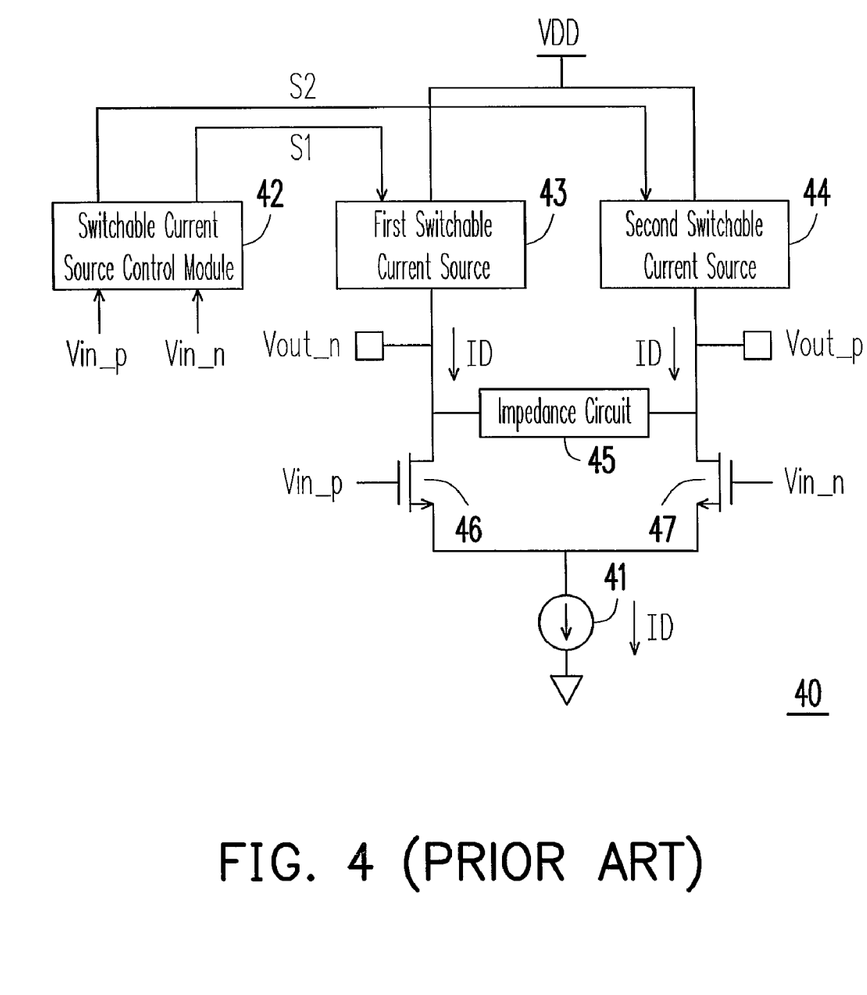
FIG. 4 is a circuit diagram of a differential signaling transmitter 40 provided by U.S. Pat. No. 6,927,608.

FIG. 4 is a circuit diagram of a differential signaling transmitter 40 provided by U.S. Pat. No. 6,927,608. Referring to FIG. 4, the transmitter 40 includes a current source 41, transistors 46, 47, impedance circuit 45, switchable current source control module 42, a first switchable current source 43, and a second switchable current source 44. The first switchable current source 43 is coupled to the switchable current source control module 42, the impedance circuit 45, and the transistor 46. The second switchable current source 44 is coupled to the switchable current source control module 42, the impedance circuit 45, and the transistor 47. The impedance circuit 45 has two terminals respectively coupled to the transistors 46 and 47. The current source 41 is coupled to the transistors 46 and 47.

The switchable current source control module 42 receives input voltages Vin_p and Vin_n, and generates control signals S1 and S2 according to the input voltages Vin_p and Vin_n. The first switchable current source 43 determines whether to generate a reference current ID according to the control signal S1, and the second switchable current source 44 determines whether to generate the reference current ID according to the control signal S2. The impedance circuit 45 is adapted for converting the reference current ID flowing therethrough into a differential voltage signal which is the difference of voltages at the two terminals Vout_p and Vout_n. The transistors 46 and 47 are respectively controlled by the input voltages Vin_p and Vin_n. The current source 41 provides the reference current ID.

When the input voltage Vin_p is at a high level, and the input voltage Vin_n is at a low level, the second switchable current source 44 generates the reference current ID, and the transistor 46 is turned on and the transistor 47 is cut off. Therefore, the reference current ID flows from the terminal Vout_p to the terminal Vout_n, and thus generating a differential voltage signal on the impedance circuit 45. When the input voltage Vin_p is at a low level, and the input voltage Vin_n is at a high level, the first switchable current source 43 generates the reference current ID, and the transistor 47 is turned on and the transistor 46 is cut off. Therefore, the reference current ID flows from the terminal Vout_n to the terminal Vout_p, and thus generating a differential voltage signal on the impedance circuit 45.

Figure 5:
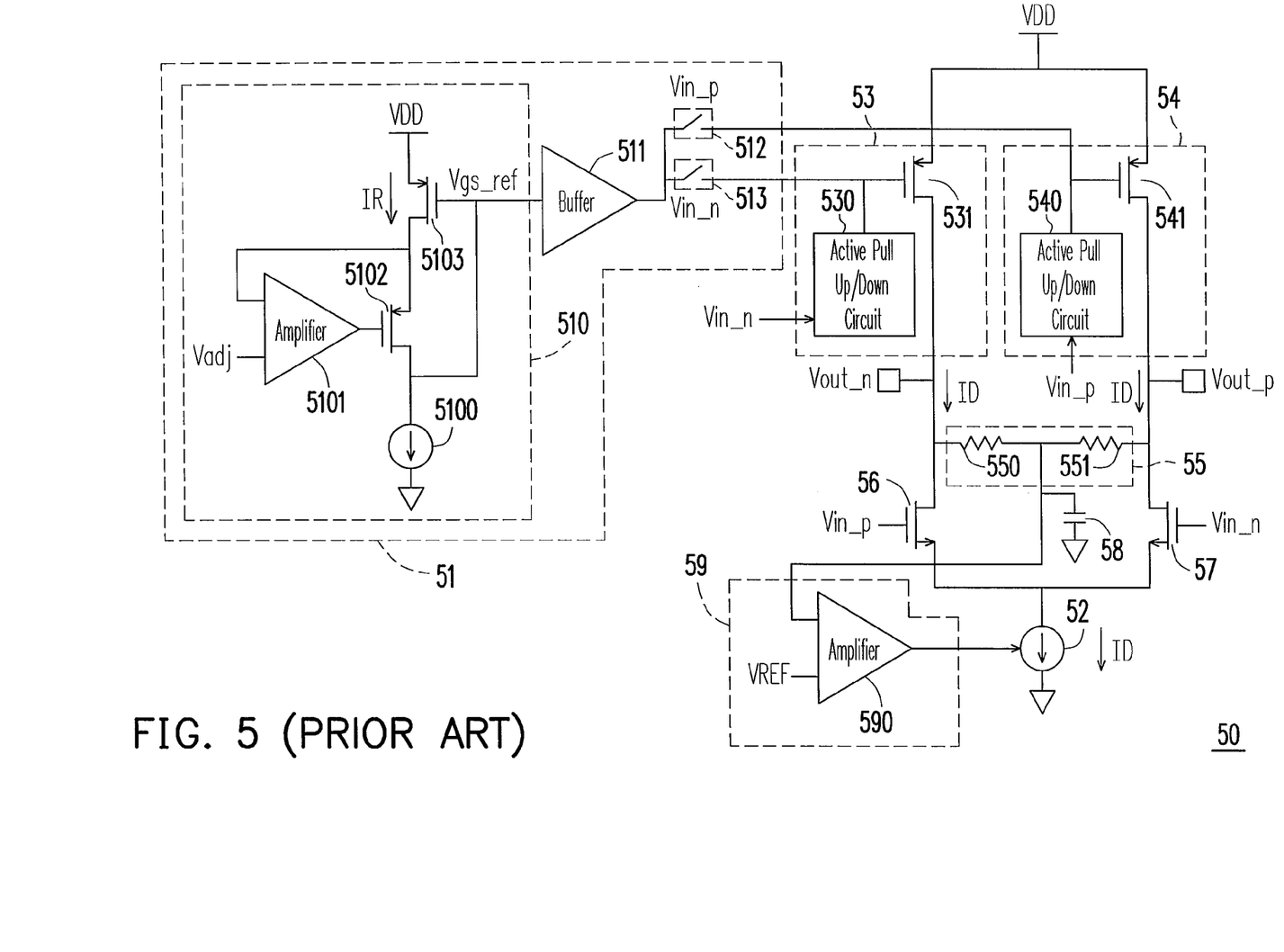
FIG. 5 is a circuit diagram of another differential signaling transmitter 50 provided by U.S. Pat. No. 6,927,608.

FIG. 5 is a circuit diagram of another differential signaling transmitter 50 provided by U.S. Pat. No. 6,927,608. Referring to FIG. 5, the transmitter 50 includes a current source 52, transistors 56 and 57, an impendence circuit 55, a switchable current source control module 51, a first switchable current source 53, a second switchable current source 54, a capacitor 58, and a common mode voltage regulation circuit 59. The first switchable current source 53 is coupled to the switchable current source control module 51, the impedance circuit 55, and the transistor 56. The second switchable current source 54 is coupled to the switchable current source control module 51, the impedance circuit 55, and the transistor 57. The impedance circuit 55 has two terminals Vout_p and Vout_n respectively coupled to the transistors 57 and 56. The current source 52 is coupled to the transistors 56 and 57. The capacitor 58 is coupled to the impedance circuit 55. The common mode voltage regulation circuit 59 is coupled to the impedance circuit 55.

The switchable current source control module 51 receives the input voltages Vin_p and Vin_n, and determines the reference current ID generated by the first switchable current source 53 or the second switchable current source 54 according to the input voltages Vin_p and Vin_n. The impedance circuit 55 is provided for converting the reference current ID flowing thereby into a differential voltage signal, which is the voltage difference between the two terminals Vout_p and Vout_n. The transistors 56 and 57 are respectively controlled by the input voltages Vin_p and Vin_n. The current source provides the reference current ID. The common mode voltage regulation circuit 59 is used for regulating the reference current ID provided by the current source 52, so as to allow a common mode voltage signal to achieve the desired voltage value.

The current source control module 51 includes an adjustable current mirror circuit 510, a buffer 511, and switches 512 and 513. The buffer 511 is coupled to the adjustable current mirror circuit 510, the switches 512 and 513. The adjustable current mirror circuit 510 receives an adjusting voltage Vadj, and generates a gate reference voltage Vgs_ref according to the adjusting voltage Vadj, and then provides the gate reference voltage Vgs_ref to the buffer 511. The buffer 511 outputs the gate reference voltage Vgs_ref to the switches 512 and 513. The switches 512 and 513 are respectively controlled by the input voltages Vin_p and Vin_n. When the input voltage Vin_p is at a high level, the gate reference voltage Vgs_ref will be outputted to the second switchable current source 54; and when the input voltage Vin_n is at a high level, the gate reference voltage Vgs_ref will be outputted to the first switchable current source 53.

The adjustable current mirror circuit 510 includes an amplifier 5101, a current source 5100, transistors 5102 and 5103. The current source 5100 is coupled to the transistors 5102 and 5103. The transistors 5102 and 5103 are coupled one to another. The amplifier 5101 is coupled to the transistors 5102 and 5103. The first switchable current source 53 includes a transistor 531 and an active pull up or down circuit 530. The transistor 531 is coupled to the active pull up or down circuit 530. The active pull up or down circuit 530 is provided for receiving the input voltage Vin_n. The second switchable current source 54 includes a transistor 541 and an active pull up or down circuit 540. The transistor 541 has a gate coupled to the active pull up or down circuit 540. The active pull up or down circuit 540 is provided for receiving the input voltage Vin_p. The active pull up or down circuits 530 and 540 are employed thereby mainly for the purpose of accelerating the switching speeds of the transistors 531 and 541, so as to compensate the delay caused by the buffer 511. The impedance circuit 55 includes two resistors 550 and 551. The resistor 550 is coupled to the resistor 551 and the capacitor 58. The common mode voltage regulation circuit 59 includes an amplifier 590 having two input terminals respectively coupled to the resistor 550 and a reference voltage signal VREF. The amplifier 590 further has an output terminal coupled to the current source 52.

When the input voltage Vin_p is at a high level, and the input voltage Vin_n is at a low level, the transistor 541 is turned on, and the second switchable current source 54 generates the reference current ID, the transistor 56 is turned on, and the transistor 57 is cut off. Meanwhile, the reference current ID flows from the terminal Vout_p to the terminal Vout_n, and generates a differential voltage signal at the impedance circuit 55. When the input voltage Vin_p is at a low level, and the input voltage Vin_n is at a high level, the transistor 531 is turned on, the first switchable current source 53 generates the reference current ID, the transistor 57 is turned on, and the transistor 56 is cut off. Meanwhile, the reference current ID flows from the terminal Vout_n to the terminal Vout_p, and generates a differential voltage signal at the impedance circuit 55.

Figure 6:
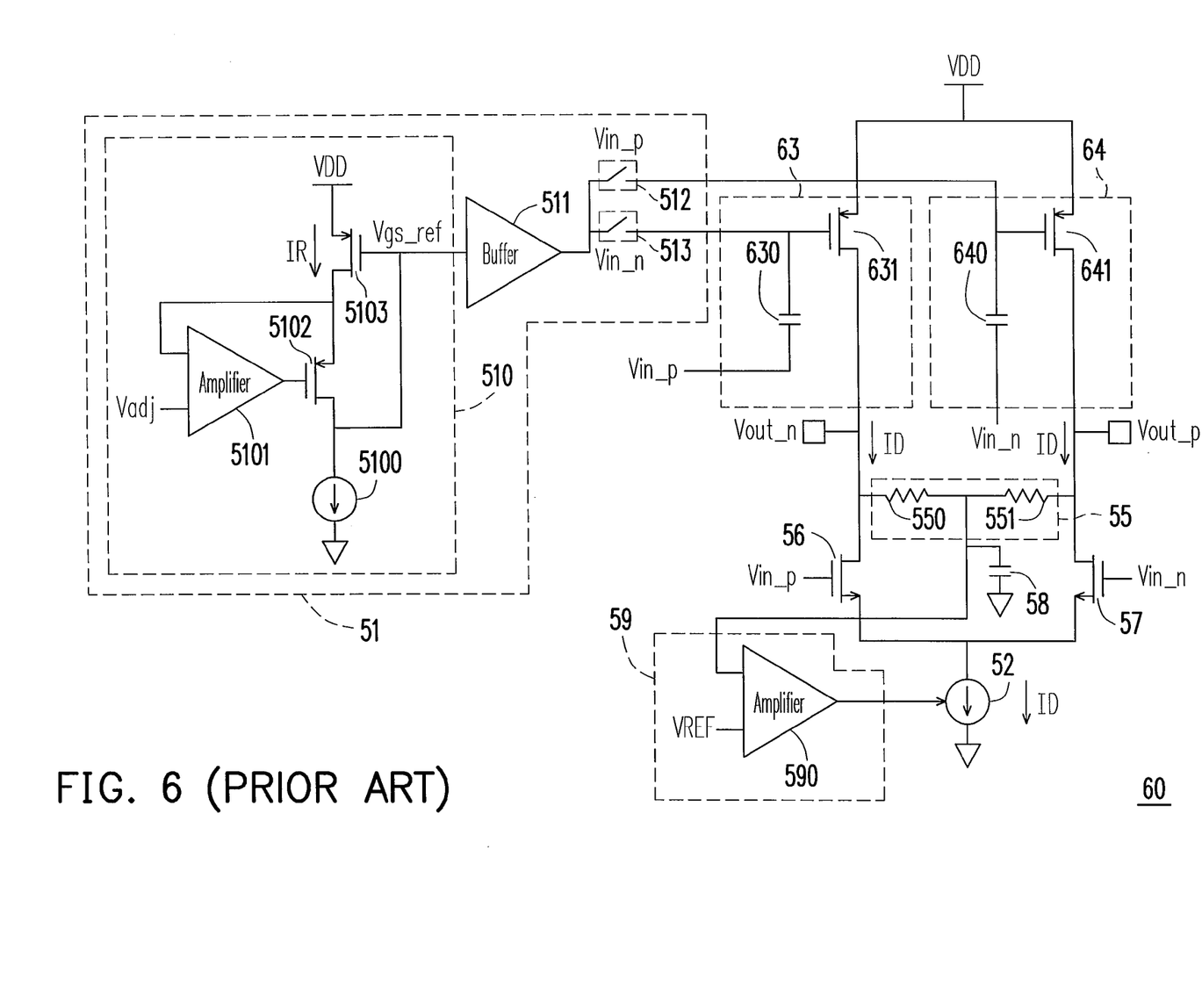
FIG. 6 is a circuit diagram of still another differential signaling transmitter 60 provided by U.S. Pat. No. 6,927,608.

FIG. 6 is a circuit diagram of still another differential signaling transmitter 60 provided by U.S. Pat. No. 6,927,608. Referring to FIG. 6, the transmitter 60 includes a current source 52, transistors 56 and 57, impedance circuit 55, a switchable current source control module 51, a first switchable current source 63, a second switchable current source 64, a capacitor 58, and a common mode voltage regulation circuit 59. FIG. 6 differs from FIG. 5 in that the first switchable current source 63 and the second switchable current source 64 of FIG. 6. The first and second switchable current sources operate with the passive pull up or down circuits, while those of FIG. 5 operate with the active pull up or down circuits. As to the principle of operation and the coupling layout of FIG. 6, they are similar as discussed above about FIG. 5, and are not to be described again hereby. As shown in FIG. 6, the first switchable current source 63 includes a capacitor 630, and a transistor 631. The transistor 631 has a gate coupled to the capacitor 630. The capacitor 630 is provided for receiving the input voltage Vin_p. The second switchable current source 64 includes a capacitor 640 and a transistor 641. The transistor 641 has a gate coupled to the capacitor 640. The capacitor 640 is provided for receiving the input voltage Vin_n. The capacitors 630 and 640 configure respectively the aforementioned pull up or down circuits.

In summary, U.S. Pat. No. 6,927,608, and U.S. Patent Application No. 2004/0150434 are all designed to use a control circuit for generating gate voltages for controlling the transistor switches. Therefore, in order to provide a better solution for the problems of the conventional differential signaling transmitters, a differential signaling transmitter is provided according to the present invention. The differential signaling transmitter is provided according to the present invention includes the switchable current sources, and the transistor switches are also served as the current sources.

SUMMARY OF THE INVENTION

Accordingly, the present invention is directed to a low power differential signaling transmitter. The low power differential signaling transmitter includes switchable current sources to allow its transistor switches to also serve as the current sources. Compared to those conventional differential signaling transmitters, the low power differential signaling transmitter according to the present invention saves headroom for two current sources. Therefore, the low power differential signaling transmitter according to the present invention is adapted for operating with a low power voltage supply, and thus consumes less power.

The present invention provides a low power differential signaling transmitter which is adapted for operating with a low power voltage supply, and thus consumes less power compared to the conventional art.

The present invention provides a low power differential signaling transmitter. The low power differential signaling transmitter includes a switchable current source apparatus and a differential signaling generator which is coupled to the switchable current source apparatus. The switchable current source apparatus receives a first input voltage and a second input voltage, and generates a plurality of reference currents according to the first input voltage and the second input voltage. The differential signaling generator includes a plurality of first transistors, a plurality of second transistors, a first output voltage terminal and a second output voltage terminal. The on or off states of the first transistors and the second transistors are controlled by the reference currents. The first output voltage terminal is provided for outputting a first output voltage, and the second output voltage terminal is provided for outputting a second output voltage. The first output voltage and the second output voltage are determined according to the on or off states of the first and second transistors.

According to an embodiment of the present invention, the reference currents include a first reference current, a second reference current, a third reference current, and a fourth reference current. The switchable current source apparatus includes a first switchable current source module and a second switchable current source module. The first switchable current source module is adapted for receiving the first and the second input voltages, and generating the first and the second reference currents according to the first and second input voltages. The second switchable current source module is adapted for receiving the first and the second input voltages, and generating the third and the fourth reference currents according to the first and second input voltages. The differential signaling generator includes a first transistor section, a second transistor section, and a common mode voltage generating module. The first transistor section is coupled to the first switchable current source module. The second transistor section is coupled to the second switchable current source module. The first transistor section is composed of the first transistors. The on or off states of the first transistors are controlled by the first and the second reference currents. The second transistor section is composed of the second transistors. The on or off statuses of the second transistors are controlled by the third and the fourth reference currents. The common mode voltage generating module is coupled with the first and the second output voltage terminals, and generates the first and the second output voltages according to a current flowing through the common mode voltage generating module. The current flowing through the common mode voltage generating module flows from the first voltage output terminal to the second output voltage terminal or flows from the second voltage output terminal to the first output voltage terminal. The flowing direction of the current is determined by the on or off states of the first and the second transistors.

The present invention provides a low power differential signaling transmitter. The low power differential signaling transmitter includes a first switchable current source module, a second switchable current source module, a first transistor section, a second transistor section, and a common mode voltage generating module. The first transistor section is coupled to the first switchable current source module. The second transistor section is coupled to the second switchable current source module. The common mode voltage generating module is coupled to the first and the second transistor sections. The first switchable current source module is adapted for receiving a first input voltage and a second input voltage, and generating a first reference current and a second reference current according to the first input voltage and the second input voltage. The second switchable current source module is adapted for receiving the first input voltage and the second input voltage, and generating a third reference current and a fourth reference current according to the first input voltage and the second input voltage. The first transistor section is controlled by the first and the second reference current, and generates a first or a second differential current according to the first reference current and the second reference current. The second transistor section is controlled by the third reference current and the fourth reference current, and generates a third differential current or a fourth differential current according to the third reference current and the fourth reference current. The common mode voltage generating module includes a first output voltage terminal and a second output voltage terminal, coupled to the first transistor section and the second transistor section respectively, for generating a first output voltage and a second output voltage according to the first, the second, the third, and the fourth differential currents.

According to an embodiment of the present invention, the first switchable current source module includes a first accelerating circuit, a second accelerating circuit, a first switch, a second switch, a first current source, and a common mode voltage error amplifier. The first switch is coupled to the first accelerating circuit. The second switch is coupled to the second accelerating circuit. The common mode voltage error amplifier is coupled to the first current source. The first accelerating circuit is provided for receiving the second input voltage, and accelerating an operation speed of the first transistor section. The second accelerating circuit is provided for receiving the first input voltage, and accelerating an operation speed of the second transistor section. The first switch is controlled by the second input voltage. The second switch is controlled by the first input voltage. The first current source is adapted for provide a first current. The common voltage error amplifier is adapted for receiving a preset reference voltage and a feedback voltage, and controlling the first current provided by the first current source according to the preset reference voltage and the feedback voltage. When the first switch is turned on, the first switchable current source module generates the first reference current; and when the second switch is turned on, the first switchable current source module generates the second reference current.

The present invention provides a low power differential signaling transmitter which is adapted for operating with a low power voltage supply, and thus it consumes less power compared to the conventional art. Compared to the conventional art, the low power differential signaling transmitter according to the present invention advantageously saves headroom for two current sources. As such, the low power differential signaling transmitter according to the present invention is adapted to work with a low power voltage supply, and thus it may save power and match the tendency toward lower power consumption of current electronic products. Further, the low power differential signaling transmitter according to the present invention is also adapted for accelerating the switching speed of the transistor switch by using the accelerating circuits, and thus it has the advantage of high speed operation.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 7:
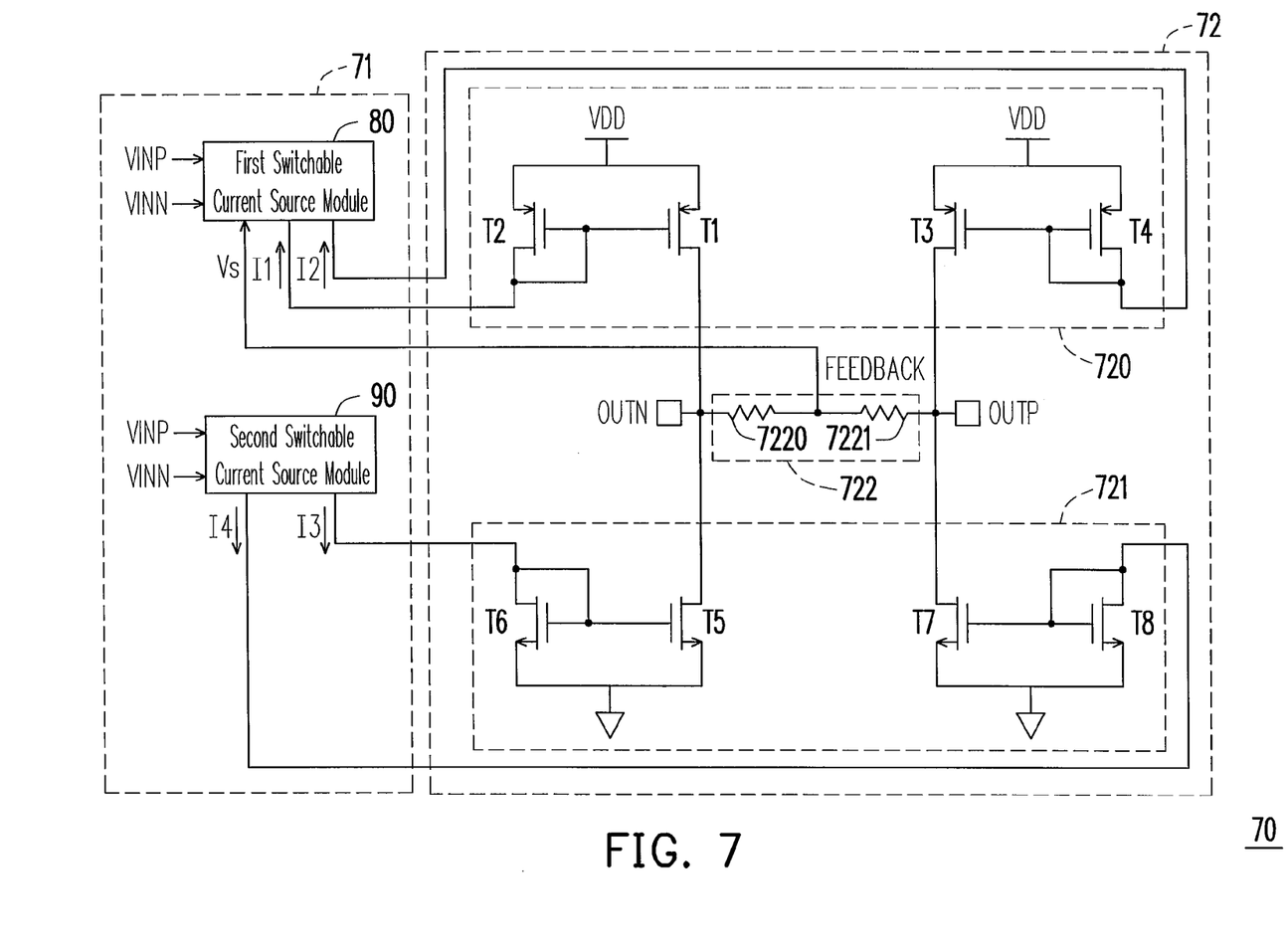
FIG. 7 is a circuit diagram illustrating a low power differential signaling transmitter 70 according to an embodiment of the present invention.

The present invention provides a low power differential signaling transmitter. The low power differential signaling transmitter according to the present invention includes the switchable current sources so as to allow a transistor switches to also serve as current sources, and thus it saves power consumption thereby. FIG. 7 is a circuit diagram illustrating a low power differential signaling transmitter 70 according to an embodiment of the present invention. Referring to FIG. 7, in the current embodiment, the low power differential signaling transmitter 70 includes a switchable current source apparatus 71, and a differential signaling generator 72. The differential signaling generator 72 is coupled to the switchable current source apparatus 71.

The switchable current source apparatus 71 is adapted for receiving input voltages VINP and VINN, and generating a plurality of reference currents I1, I2, I3, and I4 according to the input voltages VINP and VINN. The differential signaling generator 72 includes a plurality of PMOS transistors T1, T2, T3, T4, a plurality of NMOS transistors T5, T6, T7, T8, and output voltage terminals OUTN and OUTP. The on or off states of the PMOS transistors T1, T2, T3, T4 and the NMOS transistors T5, T6, T7, T8 are controlled by the reference currents I1, I2, I3, and I4. The output voltage terminal OUTP is provided for outputting a first output voltage, and the output voltage terminal OUTN is provided for outputting a second output voltage. The first output voltage and the second output voltage are determined according to the on or off states of the transistors T1~T8.

The switchable current source apparatus 71 includes a first switchable current source module 80 and a second switchable current source module 90. The first switchable current source module 80 is adapted for receiving the input voltages VINP and VINN, and generating the reference currents I1 and I2 according to the input voltages VINP and VINN. The second switchable current source module 90 is adapted for receiving the input voltages VINP and VINN, and generating the reference currents I3 and I4 according to the input voltages VINP and VINN.

The differential signaling generator 72 includes a first transistor section 720, a second transistor section 721, and a common mode voltage generating module 722. The first transistor section 720 is coupled to the first switchable current source module 80. The second transistor section 721 is coupled to the second switchable current source module 90. The common mode voltage generating module 722 is coupled to the first transistor section 720 and the second transistor section 721. The first transistor section 720 is composed of the PMOS transistors T1~T4. The on or off states of the PMOS transistors T1~T4 are controlled by the reference currents I1 and I2. The second transistor section 721 is composed of the NMOS transistors T5~T8. The on or off states of the NMOS transistors T5~T8 are controlled by the reference currents I3 and I4.

The common mode voltage generating module 722 includes output voltage terminals OUTP and OUTN, and generates the first output voltage and the second output voltage according to a current flowing through itself. The first output voltage is a voltage at the output voltage terminal OUTP, and the second output voltage is a voltage at the output voltage terminal OUTN. A value of the voltage at the output voltage terminal OUTP subtracted by the voltage at the output voltage terminal OUTN is the output voltage differential signal of the low power differential signaling transmitter 70 according to an embodiment of the present invention. The current flowing through the common mode voltage generating module 722 is determined to flow from the output voltage terminal OUTN to the output voltage terminal OUTP or flow from the output voltage terminal OUTP to the output voltage terminal OUTN, according to the on or off states of the transistors T1~T8.

The common mode voltage generating module 722 includes two resistors 7220 and 7221, which are coupled to each other. The common mode voltage generating module 722 includes a feedback voltage terminal FEEDBACK, positioned between the resistors 7220 and 7221, and output a feedback voltage signal Vs. According to an aspect of the embodiment, the first switchable current source module 80 is further adapted for receiving the feedback voltage signal Vs, so as to control values of the reference currents I1 and I2, and thus the values of the first and the second output voltages can be adjusted. However, it should be noted that this embodiment is not to restrict the scope of the present invention. For example, when a higher accuracy of the differential voltage signaling is not required, only one resistor may be used by the common mode voltage generating module 722 while omitting the feedback voltage terminal FEEDBACK and the feedback voltage Vs. Of course, the first switchable current source module 80 need not receive such a feedback signal Vs for adjusting the value of the first and the second output voltages.

The feedback voltage Vs is also designed to be received by the first switchable current source module 80, so as to allow the first switchable current source module 80 to adjust the first and the second output voltages according to the received feedback voltage Vs. It should be noted that the employment of the foregoing feedback loop is for the purpose of obtaining a more precision output voltage differential signaling, and is a preferred feature for the present invention without restricting the scope of the present invention.

The first transistor section 720 is indeed a combination of two current mirrors. The PMOS transistors T1 and T2 serve as a current mirror. The PMOS transistors T3 and T4 serve as another current mirror. A gate of the PMOS transistor T1 is coupled to a gate and a drain of the PMOS transistor T2. A drain of the PMOS transistor T1 is coupled to the output voltage terminal OUTN of the common mode voltage generating module 722. A gate of the POMS transistor T3 is coupled to a gate and a drain of the PMOS transistor T4. A drain of the PMOS transistor T3 is coupled to the output voltage terminal OUTP of the common mode voltage generating module 722.

The second transistor section 721 is also a combination of two current mirrors. The NMOS transistors T5 and T6 serve as a current mirror. The NMOS transistors T7 and T8 serve as another current mirror. A gate of the NMOS transistor T5 is coupled to a gate and a drain of the NMOS transistor T6. A drain of the NMOS transistor T5 is coupled to the output voltage terminal OUTN of the common mode voltage generating module 722. A gate of the NOMS transistor T7 is coupled to a gate and a drain of the NMOS transistor T8. A drain of the NMOS transistor T7 is coupled to the output voltage terminal OUTP of the common mode voltage generating module 722.

When the input voltage VINP is at a high level, and the input voltage VINN is at a low level, the first switchable current source module 80 provides the reference current I2 to the PMOS transistor T4, (during which the reference current I1 is 0). Because the PMOS transistors T4 and T3 serve as a current mirror, the reference current I2 is mirrored to the PMOS transistor T3 with a certain proportion. Therefore, the transistors T3 and T4 are turned on, and the transistors T1 and T2 are cut off. The second switchable current source module 90 provides the reference current I3 to the NMOS transistor T6, (during which the reference current I4 is 0). Because the NMOS transistors T6 and T5 serve as a current mirror, the reference current I3 is mirrored to the NMOS transistor T5 with a certain proportion. Therefore, the transistors T5 and T6 are turned on, and the transistors T7 and T8 are cut off. In this case, the current flowing through the common mode voltage generating module 722 flows from the output voltage terminal OUTP to the output voltage terminal OUTN.

On the contrary, when the input voltage VINP is at a low level, and the input voltage VINN is at a high level, the first switchable current source module 80 provides the reference current I1 to the PMOS transistor T2, (during which the reference current I2 is 0). Because the PMOS transistors T1 and T2 serve as a current mirror, the reference current I1 is mirrored to the PMOS transistor T1 with a certain proportion. Therefore, the transistors T1 and T2 are turned on, and the transistors T3 and T4 are cut off. The second switchable current source module 90 provides the reference current I4 to the NMOS transistor T8, (during which the reference current I3 is 0). Because the NMOS transistors T7 and T8 serve as a current mirror, the reference current I4 is mirrored to the NMOS transistor T7 with a certain proportion. Therefore, the transistors T7 and T8 are turned on, and the transistors T5 and T6 are cut off. In this case, the current flowing through the common mode voltage generating module 722 flows from the output voltage terminal OUTN to the output voltage terminal OUTP.

Figure 8:
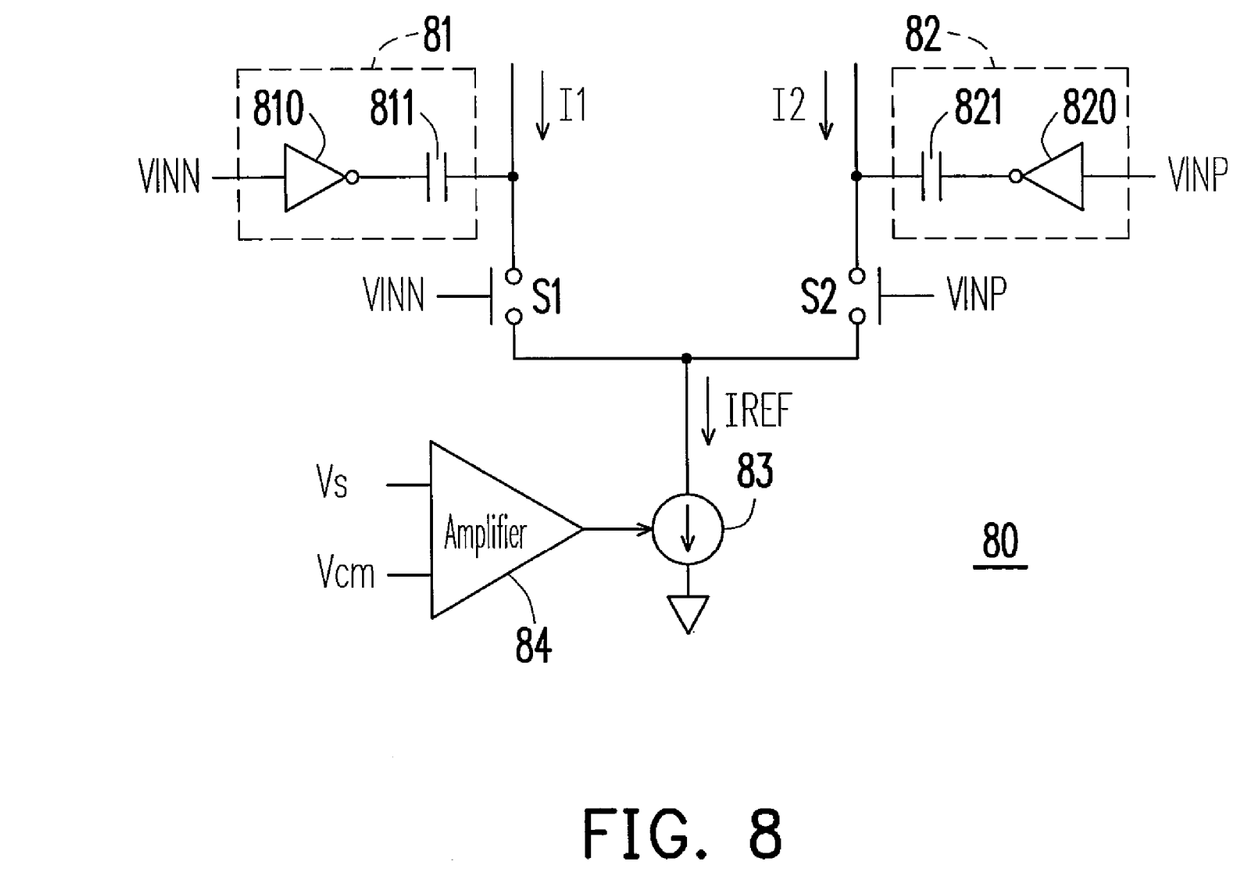
FIG. 8 is a circuit diagram illustrating a first switchable current source module 80.

FIG. 8 is a circuit diagram illustrating a first switchable current source module 80. Referring to FIG. 8, the first switchable current source module 80 includes accelerating circuits 81, 82, switches S1, S2, a current source 83 and a common mode voltage error amplifier 84. The switch S1 is coupled to the accelerating circuit 81. The switch S2 is coupled to the accelerating circuit 82. The current source 83 is coupled to the switches S1 and S2. The common mode voltage error amplifier 84 is coupled to the current source 83.

The accelerating circuit 81 includes an inverter 810, and a capacitor 811. The inverter 810 is coupled to the capacitor 811. The inverter 810 receives the input voltage VINN and outputs an inversed signal of the input voltage VINN. The accelerating circuit 81 is adapted for accelerating a switching speed of the on or off state of the transistor T1, which indicates an enhancement of the operating speed of the first transistor section 720. The accelerating circuit 82 includes an inverter 820, and a capacitor 821. The inverter 820 is coupled to the capacitor 821. The inverter 820 receives the input voltage VINP and outputs an inversed signal of the input voltage VINP. The accelerating circuit 82 is adapted for accelerating a switching speed of the on or off states of the transistor T3, which indicates an enhancement of the operating speed of the first transistor section 720.

The current source 83 provides a current IREF. The switches Si and S2 are respectively controlled by the input voltages VINN and VINP. When the input voltage VINN is at a high level, and the input voltage VINP is at a low level, the switch S1 is turned on and the switch S2 is cut off. Meanwhile, the reference current I1 is equal to IREF, and the reference current I2 is 0. When the input voltage VINN is at a low level, and the input voltage VINP is at a high level, the switch S2 is turned on and the switch S1 is cut off. Meanwhile, the reference current I2 is equal to IREF, and the reference current I1 is 0.

The common mode voltage error amplifier 84 is provided for receiving the preset reference voltage Vcm, and the feedback voltage Vs of the feedback voltage terminal FEEDBACK, and controlling the current IREF provided by the current source 83 according to the preset reference voltage Vcm and the feedback voltage Vs. The employment of the common mode voltage error amplifier 84 therein allows the feedback voltage Vs to achieve the value of the preset reference voltage Vcm, and therefore accurately controls the value of the common mode voltage signal outputted therefrom.

Further, as discussed above, if the feedback loop is not included, then the common mode voltage error amplifier 84 can also be correspondingly removed from the embodiment. Even, if the switching speeds of transistors are not a concern hereby, the accelerating circuits 80 and 81 can also be removed from the embodiment. The first switchable current source module 80 is a preferred aspect of the embodiment and is not to restrict the scope of the present invention.

Figure 9:
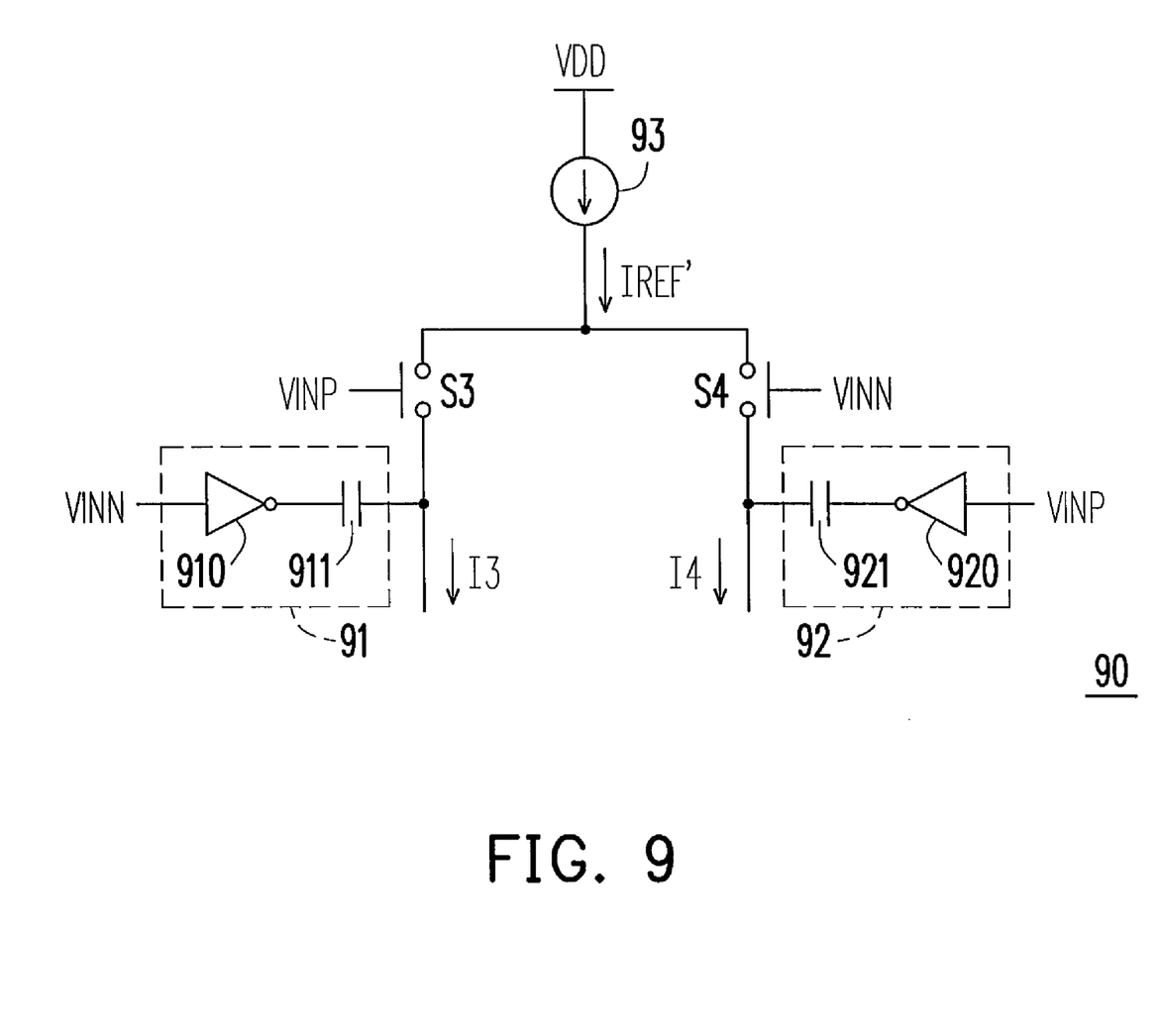
FIG. 9 is a circuit diagram illustrating a second switchable current source module 90.

FIG. 9 is a circuit diagram illustrating a second switchable current source module 90. Referring to FIG. 9, the second switchable current source module 90 includes accelerating circuits 91, 92, switches S3, S4, and a current source 93. The switch S3 is coupled to the accelerating circuit 91. The switch S4 is coupled to the accelerating circuit 92. The current source 83 is coupled to the switches S3 and S4.

The accelerating circuit 91 includes an inverter 910, and a capacitor 911. The inverter 910 is coupled to the capacitor 911. The inverter 910 receives the input voltage VINN and outputs an inversed signal of the input voltage VINN. The accelerating circuit 91 is adapted for accelerating a switching speed of the on or off status of the transistor T5, which indicates an enhancement of the operation speed of the second transistor section 721. The accelerating circuit 92 includes an inverter 920, and a capacitor 921. The inverter 920 is coupled to the capacitor 921. The inverter 920 receives the input voltage VINP and outputs an inversed signal of the input voltage VINP. The accelerating circuit 92 is adapted for accelerating a switching speed of the on or off status of the transistor T7, which indicates an enhancement of the operation speed of the second transistor section 721.

The current source 93 provides a current IREF'. The switches S4 and S3 are respectively controlled by the input voltages VINN and VINP. When the input voltage VINN is at a high level, and the input voltage VINP is at a low level, the switch S4 is turned on and the switch S3 is cut off. Meanwhile, the reference current I4 is equal to IREF', and the reference current I3 is 0. When the input voltage VINN is at a low level, and the input voltage VINP is at a high level, the switch S3 is turned on and the switch S4 is cut off. Meanwhile, the reference current I3 is equal to IREF', and the reference current I4 is 0.

Further, the common mode voltage error amplifier 84 may be moved to the second switchable current source module 90 similar with that of the first switchable current source module 80 for obtaining desired common voltage signal for outputting. Even if the switching speeds of transistors are not a concern hereby, the accelerating circuits 90 and 91 can also be removed from the embodiment. The second switchable current source module 90 is a preferred aspect of the embodiment and is not to restrict the scope of the present invention.

In summary, the present invention employs the switchable current sources to allow the transistor switches to also serve as the current sources. Compared to the conventional, the low power differential signaling transmitter according to the present invention advantageously saves headroom for two current sources. As such, the low power differential signaling transmitter according to the present invention is adapted to work with a low power voltage supplying. Thus the power is saved, and the tendency toward lower power consumption of current electronic products is matched. Further, the low power differential signaling transmitter according to the present invention is also adapted for accelerating the switching speed of the transistor switch by using the accelerating circuits, and thus it may have the advantage of high speed operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A low power differential signaling transmitter, comprising:
    a switchable current source apparatus, used for receiving a first input voltage and a second input voltage, and generating a plurality of reference currents according to the first input voltage and the second input voltage; and
    a differential signaling generator, coupled to the switchable current source apparatus, comprising:
    a plurality of first transistors;
    a plurality of second transistors;
    a first output voltage terminal;
    a second output voltage terminal; and
    wherein on or off states of the first transistors and the second transistors are controlled by the reference currents; the first output voltage terminal is adapted for outputting a first output voltage; the second output voltage terminal is adapted for outputting a second output voltage; and the first output voltage and the second output voltage are determined according to the on or off states of the first and second transistors,
    wherein the switchable current source apparatus comprises:
    a first switchable current source module, used for receiving the first and the second input voltages, and generating a first and a second reference currents according to the first and second input voltages; and
    a second switchable current source module, used for receiving the first and the second input voltages, and generating a third and a fourth reference currents according to the first and second input voltage,
    wherein the first switchable current source module comprises:
    a first accelerating circuit, used for receiving the second input voltage, and accelerating a switching speed of the on or off states of the first transistors, the first accelerating circuit comprising an inverter, for receiving the second input voltage and outputting an inversed signal of the second input voltage; and a capacitor, coupled to the inverter;
    a second accelerating circuit, used for receiving the first input voltage, and accelerating a switching speed of the on or off states of the first transistors;
    a first switch, coupled to the first accelerating circuit, and controlled by the second input voltage;
    a second switch, coupled to the second accelerating circuit, and controlled by the first input voltage;
    a first current source, coupled to the first switch and the second switch, for providing a first current; and
    wherein when the first switch is turned on, the first switchable current source module generates the first reference current, and when the second switch is turned on, the first switchable current source module generates the second reference current.

2. The low power differential signaling transmitter according to claim 1, wherein the first transistors form a first transistor section coupled to the first switchable current source module, and the on or off states of the first transistors are controlled by the first and the second reference currents; the second transistors form a second transistor section coupled to the second switchable current source module and the on or off states of the second transistors are controlled by the third and the fourth reference currents; and the different signaling generator further comprises a common mode voltage generating module coupled to the first transistor section and the second transistor section for determining values of the first voltage and the second voltage according to a current flowing through the common mode voltage generating module, wherein the current flowing through the common mode voltage generating module from the first voltage output terminal to the second output voltage terminal or from the second voltage output terminal to the first output voltage terminal is determined according to the on or off states of the first transistors and the second transistors.

3. The low power differential signaling transmitter according to claim 2, wherein the common mode voltage generating module comprises:
    a first resistor coupled to the first voltage output terminal;
    a second resistor coupled to the first resistor and the second voltage output terminal; and
    wherein the common mode voltage generating module further comprises a feedback voltage terminal positioned between the first resistor and the second resistor.

4. The low power differential signaling transmitter according to claim 3, wherein the first switchable current source module further comprises:
    a common mode voltage error amplifier, coupled to a first current source, for receiving a preset reference voltage and a feedback voltage of the feedback voltage terminal, and controlling a first current provided by the first current source according to the preset reference voltage and the feedback voltage.

5. The low power differential signaling transmitter according to claim 1, wherein the second accelerating circuit comprises:
    an inverter, for receiving the first input voltage and outputting an inversed signal of the first input voltage; and
    a capacitor, coupled to the inverter.

6. The low power differential signaling transmitter according to claim 1, wherein the second switchable current source module comprises:
- a third accelerating circuit, for receiving the second input voltage, and accelerating a switching speed of the on or off states of the second transistors;
- a fourth accelerating circuit, for receiving the first input voltage, and accelerating a switching speed of the on or off states of the second transistors;
- a third switch, coupled to the third accelerating circuit, and controlled by the first input voltage;
- a fourth switch, coupled to the second accelerating circuit, and controlled by the second input voltage;
- a second current source, coupled to the third switch and the fourth switch, for providing a second current; and
- wherein when the third switch is turned on, the second switchable current source module generates the third reference current; and when the fourth switch is turned on, the second switchable current source module generates the fourth reference current.

7. The low power differential signaling transmitter according to claim 6, wherein the third accelerating circuit comprises:
- an inverter, for receiving the second input voltage and outputting an inversed signal of the second input voltage; and
- a capacitor, coupled to the inverter.

8. The low power differential signaling transmitter according to claim 6, wherein the fourth accelerating circuit comprises:
- an inverter, for receiving the first input voltage and outputting an inversed signal of the first input voltage; and
- a capacitor, coupled to the inverter.

9. The low power differential signaling transmitter according to claim 2, wherein the first transistors comprise a first PMOS transistor, a second PMOS transistor, a third PMOS transistor, and a fourth PMOS transistor,
- wherein a gate of the first PMOS transistor is coupled to a gate and a drain of the second PMOS transistor; a drain of the first PMOS transistor is coupled to the second output voltage terminal of the common mode voltage generating module; the drain of the second PMOS transistor is used for receiving the first reference current; a gate of the third PMOS transistor is coupled to a gate and a drain of the fourth PMOS transistor; and a drain of the third PMOS transistor is coupled to the first output voltage terminal of the common mode voltage generating module; and the drain of the fourth PMOS transistor is used for receiving the second reference current.

10. The low power differential signaling transmitter according to claim 2, wherein the second transistors comprise a first NMOS transistor, a second NMOS transistor, a third NMOS transistor, and a fourth NMOS transistor,
- wherein a gate of the first NMOS transistor is coupled to a gate and a drain of the second NMOS transistor; a drain of the first NMOS transistor is coupled to the second output voltage terminal of the common mode voltage generating module; the drain of the second NMOS transistor is used for receiving the third reference current; a gate of the third NMOS transistor is coupled to a gate and a drain of the fourth NMOS transistor; and a drain of the third NMOS transistor is coupled to the first output voltage terminal of the common mode voltage generating module; and the drain of the fourth NMOS transistor is used for receiving the fourth reference current.

11. A low power differential signaling transmitter, comprising:
- a first switchable current source module, used for receiving a first input voltage and a second input voltage, and generating a first reference current and a second reference current according to the first input voltage and the second input voltage;
- a second switchable current source module, used for receiving the first input voltage and the second input voltage, and generating a third reference current and a fourth reference current according to the first input voltage and the second input voltage;
- a first transistor section, coupled to the first switchable current source module, controlled by the first reference current and the second reference current, and used to generate a first differential current and second differential current according to the first reference current and the second reference current;
- a second transistor section, coupled to the second switchable current source module, controlled by the third reference current and the fourth reference current, and used to generate a third differential current and a fourth differential current according to the third reference current and the fourth reference current; and
- a common mode voltage generating module, having a first output voltage terminal and a second output voltage terminal, the common mode voltage generating module being coupled to the first transistor section and the second transistor section respectively, for generating a first output voltage and a second output voltage according to the first, the second, the third, and the fourth differential currents,
- wherein the first switchable current source module comprises:
  - a first accelerating circuit, used for receiving the second input voltage, and accelerating an operation speed of the first transistor section;
  - a second accelerating circuit, used for receiving the first input voltage, and accelerating an operation speed of the first transistor section;
  - a first switch, coupled to the first accelerating circuit, and controlled by the second input voltage;
  - a second switch, coupled to the second accelerating circuit, and controlled by the first input voltage;
  - a first current source, coupled to the first switch and the second switch, for providing a first current;
  - a common mode voltage error amplifier, coupled to the first current source for receiving a preset reference voltage and a feedback voltage, and controlling the first current provided by the first current source according to the preset reference voltage and the feedback voltage; and
  - wherein when the first switch is turned on, the first switchable current source module generates the first reference current, and when the second switch is turned on, the first switchable current source module generates the second reference current.

12. The low power differential signaling transmitter according to claim 11, wherein the common mode voltage generating module comprises:
- a first resistor coupled to the first voltage output terminal;
- a second resistor coupled to the first resistor and the second voltage output terminal; and
- a feedback voltage terminal positioned between the first resistor and the second resistor.

13. The low power differential signaling transmitter according to claim 11, wherein the first accelerating circuit comprises:

an inverter, for receiving the second input voltage and outputting an inversed signal of the second input voltage; and a capacitor, coupled to the inverter.

14. The low power differential signaling transmitter according to claim 11, wherein the second accelerating circuit comprises:

an inverter, for receiving the first input voltage and outputting an inversed signal of the first input voltage; and a capacitor, coupled to the inverter.

15. The low power differential signaling transmitter according to claim 11, wherein the second switchable current source module comprises:

a third accelerating circuit, for receiving the second input voltage, and accelerating an operation speed of the second transistor section;

a fourth accelerating circuit, for receiving the first input voltage, and accelerating an operation speed of the of the second transistors;

a third switch, coupled to the third accelerating circuit, and controlled by the first input voltage;

a fourth switch, coupled to the second accelerating circuit, and controlled by the second input voltage;

a second current source, coupled to the third switch and the fourth switch, for providing a second current; and wherein when the third switch is turned on, the second switchable current source module generates the third reference current; and when the fourth switch is turned on, the second switchable current source module generates the fourth reference current.

16. The low power differential signaling transmitter according to claim 15, wherein the third accelerating circuit comprises:

an inverter, for receiving the second input voltage and outputting an inversed signal of the second input voltage; and a capacitor, coupled to the inverter.

17. The low power differential signaling transmitter according to claim 15, wherein the fourth accelerating circuit comprises:

an inverter, for receiving the first input voltage and outputting an inversed signal of the first input voltage; and a capacitor, coupled to the inverter.

18. The low power differential signaling transmitter according to claim 11, wherein the first transistor section comprises:

a first current mirror, coupled to the second output voltage terminal, controlled by the first reference current, for generating the first differential current; and a second current mirror, coupled to the first output voltage terminal, controlled by the second reference current, for generating the second differential current.

19. The low power differential signaling transmitter according to claim 11, wherein the second transistor section comprises:

a third current mirror, coupled to the second output voltage terminal, controlled by the third reference current, for generating the third differential current; and a fourth current mirror, coupled to the first output voltage terminal, controlled by the fourth reference current, for generating the fourth differential current.

* * * * *